United States Patent
Murakami et al.

(10) Patent No.: US 8,674,369 B2
(45) Date of Patent: Mar. 18, 2014

(54) LIGHT EMITTING DEVICE, METHOD FOR MANUFACTURING THEREOF AND ELECTRONIC APPLIANCE

(75) Inventors: Satoshi Murakami, Atsugi (JP); Masayuki Sakakura, Ebina (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/478,659

(22) Filed: May 23, 2012

(65) Prior Publication Data

US 2012/0228622 A1 Sep. 13, 2012

Related U.S. Application Data

(60) Continuation of application No. 12/915,171, filed on Oct. 29, 2010, now Pat. No. 8,198,635, and a division of application No. 11/709,062, filed on Feb. 22, 2007, now Pat. No. 7,829,894, and a division of application No. 11/078,455, filed on Mar. 14, 2005, now Pat. No. 7,183,147.

(30) Foreign Application Priority Data

Mar. 25, 2004 (JP) ................................ 2004-089213

(51) Int. Cl.
| | | |
|---|---|---|
| H01L 27/14 | (2006.01) | |
| H01L 29/04 | (2006.01) | |
| H01L 29/15 | (2006.01) | |
| H01L 31/036 | (2006.01) | |
| H01L 21/00 | (2006.01) | |

(52) U.S. Cl.
USPC ............................................. 257/72; 438/34

(58) Field of Classification Search
USPC ................... 438/22–47; 257/66–72, 79–106;
345/30–111; 313/498–512;
349/56–166
See application file for complete search history.

(56) References Cited

U.S. PATENT DOCUMENTS

| 4,792,210 A | 12/1988 | Maurice |
|---|---|---|
| 5,234,541 A | 8/1993 | Shannon et al. |

(Continued)

FOREIGN PATENT DOCUMENTS

| EP | 1 041 622 A | 10/2000 |
|---|---|---|
| JP | 60-251665 | 12/1985 |

(Continued)

Primary Examiner — Fernando L Toledo
Assistant Examiner — Karen Kusumakar
(74) Attorney, Agent, or Firm — Eric J. Robinson; Robinson Intellectual Property Law Office, P.C.

(57) ABSTRACT

An object of the invention is to provide a method for manufacturing a light emitting device capable of reducing deterioration of elements due to electrostatic charge caused in manufacturing the light emitting device. Another object of the invention is to provide a light emitting device in which defects due to the deterioration of elements caused by the electrostatic charge are reduced. The method for manufacturing the light emitting device includes a step of forming a top-gate type transistor for driving a light emitting element. In the step of forming the top-gate type transistor, when processing a semiconductor layer, a first grid-like semiconductor layer extending in rows and columns is formed over a substrate. The plurality of second island-like semiconductor layers are formed between the first semiconductor layer. The plurality of second island-like second semiconductor layers serve as an active layer of the transistor.

26 Claims, 10 Drawing Sheets

(56) References Cited

U.S. PATENT DOCUMENTS

| | | |
|---|---|---|
| 5,650,834 A | 7/1997 | Nakagawa et al. |
| 5,764,320 A | 6/1998 | Konuma et al. |
| 5,824,235 A | 10/1998 | Yamazaki et al. |
| 5,936,698 A | 8/1999 | Koyama |
| 5,938,942 A | 8/1999 | Yamazaki et al. |
| 6,013,542 A | 1/2000 | Yamazaki et al. |
| 6,072,556 A | 6/2000 | Hirakata et al. |
| 6,239,850 B1 | 5/2001 | Ohori et al. |
| 6,246,454 B1 | 6/2001 | Koyama et al. |
| 6,358,767 B2 | 3/2002 | Eguchi |
| 6,387,737 B1 | 5/2002 | Yamazaki et al. |
| 6,411,351 B1 * | 6/2002 | Zhang et al. ............... 349/54 |
| 6,538,708 B2 | 3/2003 | Zhang |
| 6,555,968 B2 * | 4/2003 | Yamazaki et al. ......... 315/169.3 |
| 6,777,254 B1 | 8/2004 | Yamazaki et al. |
| 6,861,670 B1 | 3/2005 | Ohtani et al. |
| 7,023,518 B1 | 4/2006 | Koyama et al. |
| 7,112,115 B1 * | 9/2006 | Yamazaki et al. ............... 445/25 |
| 7,220,627 B2 | 5/2007 | Yamazaki et al. |
| 7,385,348 B2 | 6/2008 | Park et al. |
| 7,416,977 B2 | 8/2008 | Fukuchi et al. |
| 7,453,094 B2 | 11/2008 | Takayama et al. |
| 7,781,768 B2 | 8/2010 | Sakakura et al. |
| 8,044,397 B2 | 10/2011 | Takayama et al. |
| 8,101,990 B2 | 1/2012 | Tsurume et al. |
| 2002/0113248 A1 * | 8/2002 | Yamagata et al. ............ 257/187 |
| 2002/0158568 A1 * | 10/2002 | Satake ......................... 313/493 |
| 2004/0232418 A1 * | 11/2004 | Koyama et al. ................. 257/59 |
| 2005/0046346 A1 | 3/2005 | Tsuchiya et al. |
| 2005/0098894 A1 | 5/2005 | Ohtani et al. |
| 2008/0057602 A1 | 3/2008 | Yamazaki et al. |
| 2008/0246036 A1 | 10/2008 | Yamazaki et al. |

FOREIGN PATENT DOCUMENTS

| | | |
|---|---|---|
| JP | 61-088557 | 5/1986 |
| JP | 05-203985 | 8/1993 |
| JP | 05-333377 | 12/1993 |
| JP | 06-075246 | 3/1994 |
| JP | 06-301058 | 10/1994 |
| JP | 07-225393 | 8/1995 |
| JP | 11-068110 A | 3/1999 |
| JP | 11-220165 A | 8/1999 |
| JP | 2000-147556 A | 5/2000 |
| JP | 2000-349301 A | 12/2000 |
| JP | 2001-166701 A | 6/2001 |
| JP | 2002-072232 A | 3/2002 |
| JP | 2003-151770 A | 5/2003 |

* cited by examiner

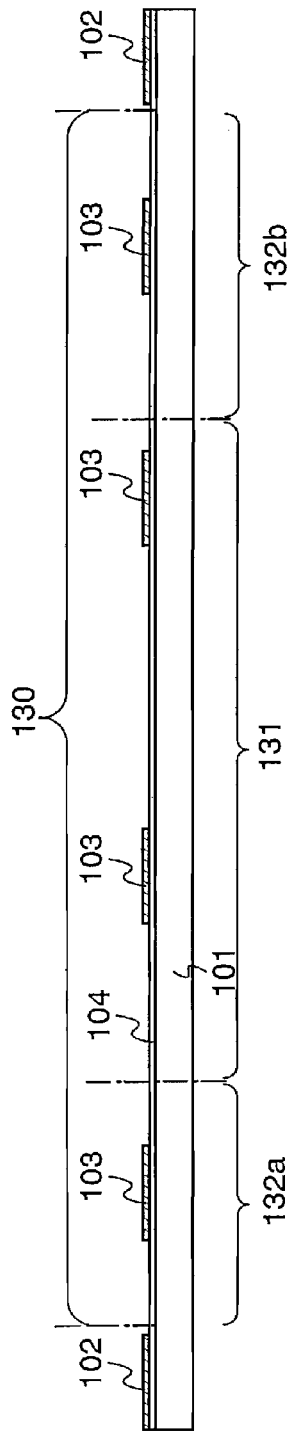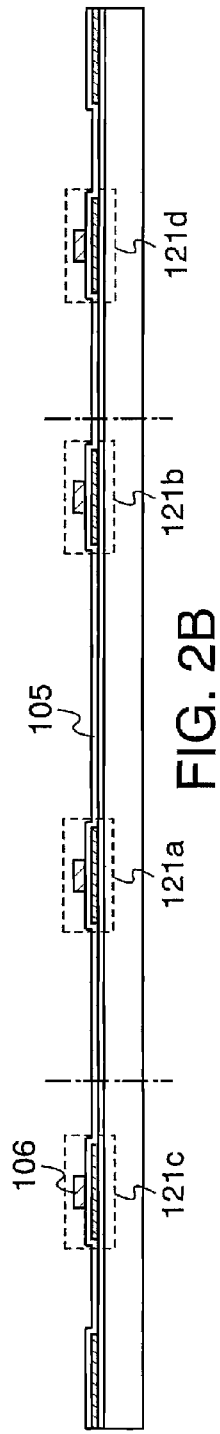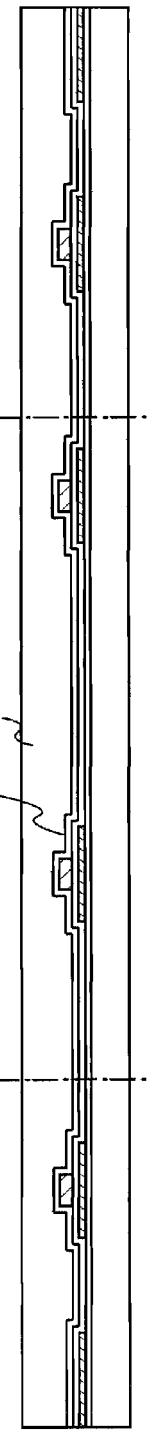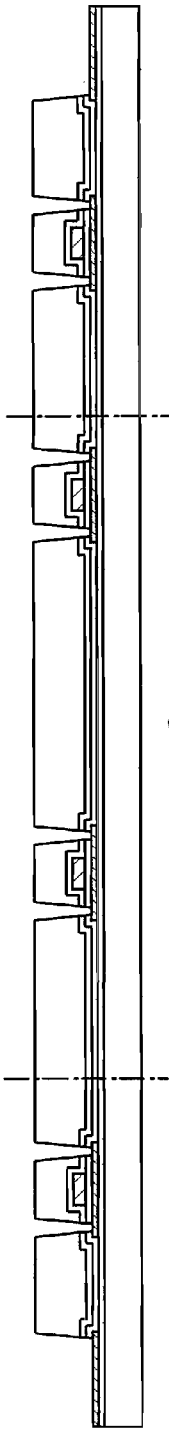

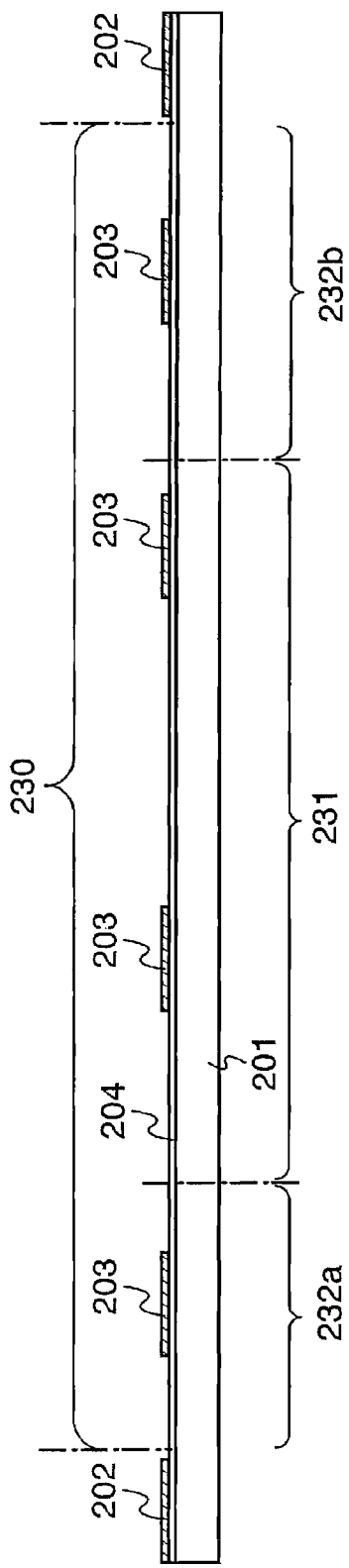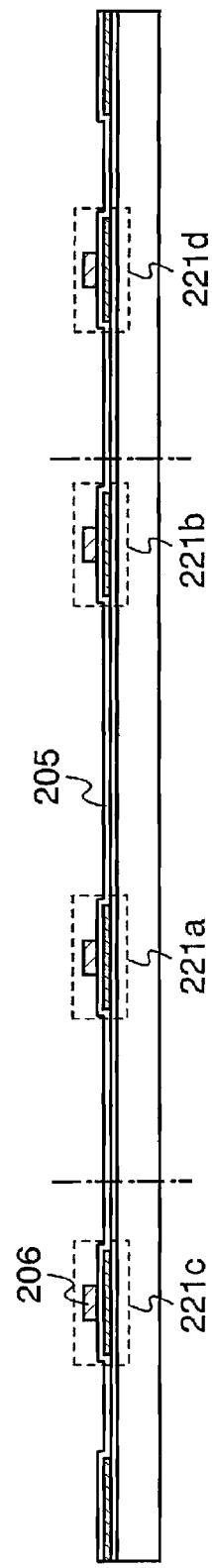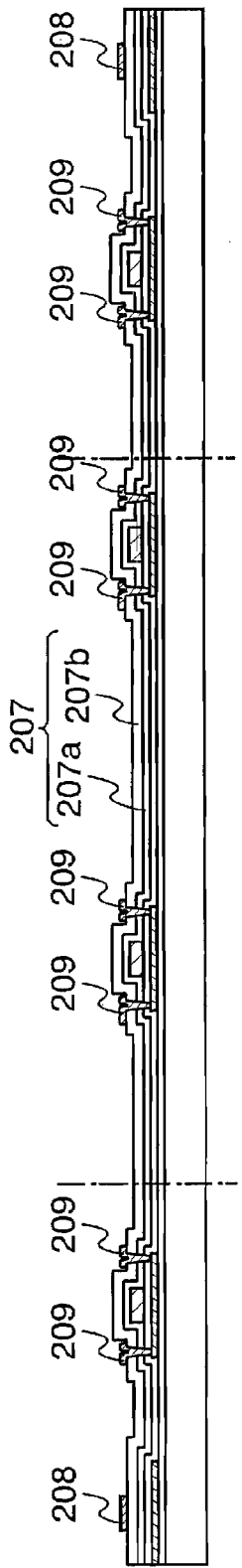

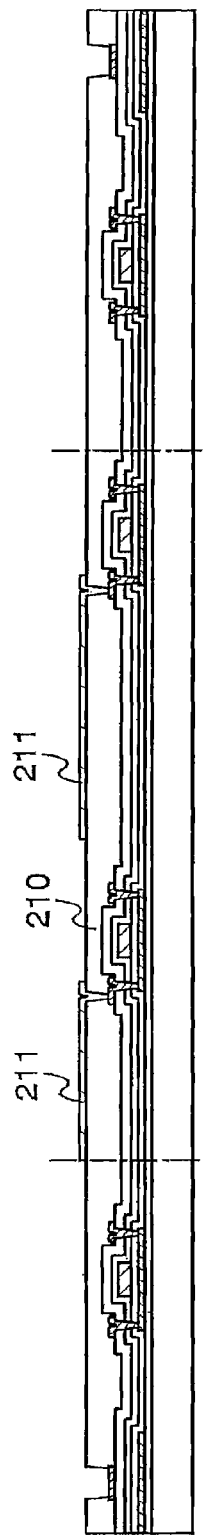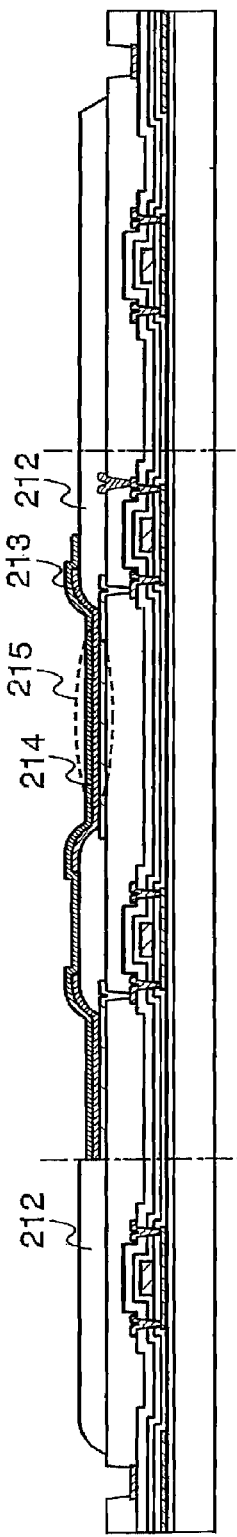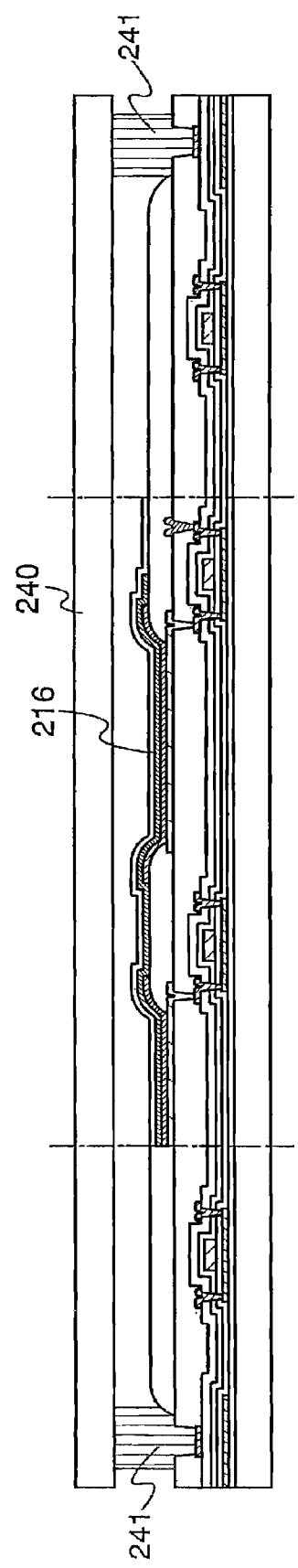

LIGHT EMITTING DEVICE, METHOD FOR MANUFACTURING THEREOF AND ELECTRONIC APPLIANCE

BACKGROUND OF THE INVENTION

1. Field of the Invention

The present invention relates to a light emitting device manufactured by using a large size substrate and a method for manufacturing thereof.

2. Description of the Related Art

A light emitting device utilizing light emission of an electroluminescent element (a light emitting element) has been attracting attention as a display device with wide viewing angle and low power consumption. In recent years, development for the purpose of mass-production of such the light emitting devices has been carried out.

One of the problems in the mass-production of the light emitting devices is the development of a technique for manufacturing the light emitting devices by using a large size substrate. By using the large size substrate, a large size television and the like can be manufactured. In addition, small light emitting devices that are mounted on small electronic appliances such as cellular phones can be mass-produced by using a large size substrate.

However, a large-scale processing apparatus is required in processing a large size substrate when manufacturing a light emitting device using the large size substrate. Therefore, it is difficult to process the entire surface of the substrate under uniform conditions. When using a substrate made from a material that is easily charged, e.g., glass, charge is easily accumulated in a part of the substrate in plasma processing and so on if the entire surface of the substrate is not processed under the uniform conditions. When the accumulated charge moves through elements during process, a large amount of current flows through a migration path of the charge so that deterioration of the elements is sometimes caused.

In order to reduce the deterioration due to the foregoing electrostatic charge, various measures, e.g., arrangement of a short ring that is connected to an input terminal for transmitting signals to a display portion by a conductive film, have been tried. Additionally, a technique of providing a electrostatic charge absorption pattern made from a film of a wiring layer or an electric capacitance is proposed in Japanese Patent Application Laid-Open No. Hei 6-75246 [Patent document 1] so as to reduce the deterioration of the elements due to the electrostatic charge.

When using the short ring, however, it is difficult to prevent the deterioration of the elements due to electrostatic charge caused in process up to formation of the short ring. Further, unnecessary portions after fabricating elements thereover are caused in the technique disclosed in the patent document 1, and hence, the entire surface of the substrate cannot be utilized effectively.

SUMMARY OF THE INVENTION

It is an object of the present invention to provide a method for manufacturing a light emitting device, wherein deterioration of elements due to electrostatic charge caused in manufacturing the light emitting device can be reduced. Further, it is another object of the invention to provide a light emitting device with reduced defects that are caused by the deterioration of the elements due to electrostatic charge.

In an aspect of the invention, a method for manufacturing a light emitting device includes a step of manufacturing a top-gate type transistor for driving a light emitting element. In the step of manufacturing the transistor, when processing a semiconductor layer, a first grid-like semiconductor layer extending in rows and columns is formed over a substrate and a plurality of second island-like semiconductor layers is formed between the first grid-like semiconductor layer. The second island-like semiconductor layers serve as active layers of the transistor. The top-gate type transistor is a transistor whose active layer is formed before the formation of the gate electrode of the transistor.

In another aspect of the invention, a method for manufacturing a light emitting device includes a step of manufacturing a transistor for driving a light emitting element. Here, the transistor is formed by sequentially laminating a semiconductor layer, an insulating layer and a conductive layer. In the step of manufacturing the transistor, when processing a semiconductor layer, a first grid-like semiconductor layer extending in rows and columns is formed over a substrate and a plurality of second island-like semiconductor layers is formed between the first grid-like semiconductor layer. The second island-like semiconductor layers serve as active layers of the transistor.

In another aspect of the invention, a method for manufacturing a light emitting device includes a step of manufacturing a top-gate type transistor for driving a light emitting element. In the step of manufacturing the transistor, when processing a semiconductor layer, a plurality of groups including a plurality of first island-like semiconductor layers is formed over a substrate and a second grid-like semiconductor layer extending in rows and columns is formed so as to surround each of the plurality of groups. The first island-like semiconductor layers serve as active layers of the transistor.

In another aspect of the invention, a method for manufacturing a light emitting device includes a step of manufacturing a transistor for driving a light emitting element. Here, the transistor is formed by sequentially laminating a semiconductor layer, an insulating layer and a conductive layer. In the step of manufacturing the transistor, when processing a semiconductor layer, a plurality of groups including a plurality of first island-like semiconductor layers is formed over a substrate and a second grid-like semiconductor layer extending in rows and columns is formed so as to surround each of the plurality of groups. The second grid-like semiconductor layer serves as an active layer of the transistor.

The above-mentioned methods for manufacturing the light emitting devices may further include a step of adding an impurity to the first grid-like semiconductor layer or the plurality of island-like semiconductor layers. Note that one or both of n-type and p-type impurities may be added thereinto.

In another aspect of the invention, a light emitting device includes a first substrate having an element group that includes a light emitting element and a transistor and a second substrate attached to the first substrate with a sealing material so as to seal the element group. In the first substrate, the element group is covered with an insulating layer having an opening, the opening is provided in an upper part of a semiconductor layer that surrounds the element group, and the sealing material is provided so as to fill the opening.

In another aspect of the invention, a light emitting device includes a first substrate having an element group that includes a light emitting element and a transistor and a second substrate attached to the first substrate with a sealing material so as to seal the element group. In the first substrate, the element group is covered with an insulating layer having an opening that is provided in an upper part of a semiconductor layer surrounding the element group such that a conductive layer overlapping with the semiconductor layer is exposed from the opening, and the sealing material is provided so as to fill the opening.

In another aspect of the invention, a light emitting device includes a first substrate having an element group that includes a light emitting element and a transistor and a second substrate attached to the first substrate with a sealing material so as to seal the element group. In the first substrate, the element group is surrounded by a semiconductor layer and covered with an insulating film, a conductive layer overlapping with the semiconductor layer is exposed from the edge of the insulating layer, and the sealing material is provided to cover the conductive layer and the edge of the insulating layer.

In each of the above-mentioned light emitting devices of the invention, the semiconductor layer is preferably added with one or both of n-type and p-type impurities. Preferably, the insulating layer is a flat layer, e.g., a layer made from a self-planarizing substance such as acrylic, siloxane (which is a substance including a skeleton structure formed by silicon (Si)-oxygen (O) bonds and containing at least hydrogen in its organic group) and polyimide, or a layer formed by planarizing a silicon oxide layer or the like by CMP (chemical and mechanical polishing) etc. Further, the sealing material preferably contains a substance with a low moisture permeability such as bisphenol A liquid resin, bisphenol A solid resin, epoxy resin containing bromine, bisphenol F resin, bisphenol AD resin, phenol resin, cresol resin, novolac resin, cyclic aliphatic epoxy resin, epibis epoxy resin, glycidyl ether resin, glycidyl amine resin, heterocyclic epoxy resin and modified epoxy resin.

According to the invention, a technique of manufacturing light emitting devices capable of reducing defects due to electrostatic charge and utilizing a substrate effectively can be obtained. Furthermore, a good light emitting device in which the defects due to the electrostatic charge are reduced can be obtained.

BRIEF DESCRIPTION OF THE DRAWINGS

FIGS. 2A to 2D are cross sectional views explaining a method for manufacturing a light emitting device according to the invention;

FIGS. 4A to 4C are cross sectional views explaining a method for manufacturing a light emitting device according to the invention;

FIGS. 5A to 5C are cross sectional views explaining a method for manufacturing a light emitting device according to the invention;

DETAILED DESCRIPTION OF THE INVENTION

The embodiment modes according to the present invention will hereinafter be described. The present invention can be carried out in many different modes, and it is easily understood by those who skilled in the art that embodiment modes and details herein disclosed can be modified in various ways without departing from the purpose and the scope of the invention. The present invention should not be interpreted as being limited to the description of the embodiment mode to be given below.

Embodiment Mode 1

The present embodiment mode will describe a method for manufacturing plural light emitting devices, wherein the plural light emitting devices are manufactured over a substrate and then the substrate is cut (i.e., divided) to be used for each light emitting device.

Figure 1A:
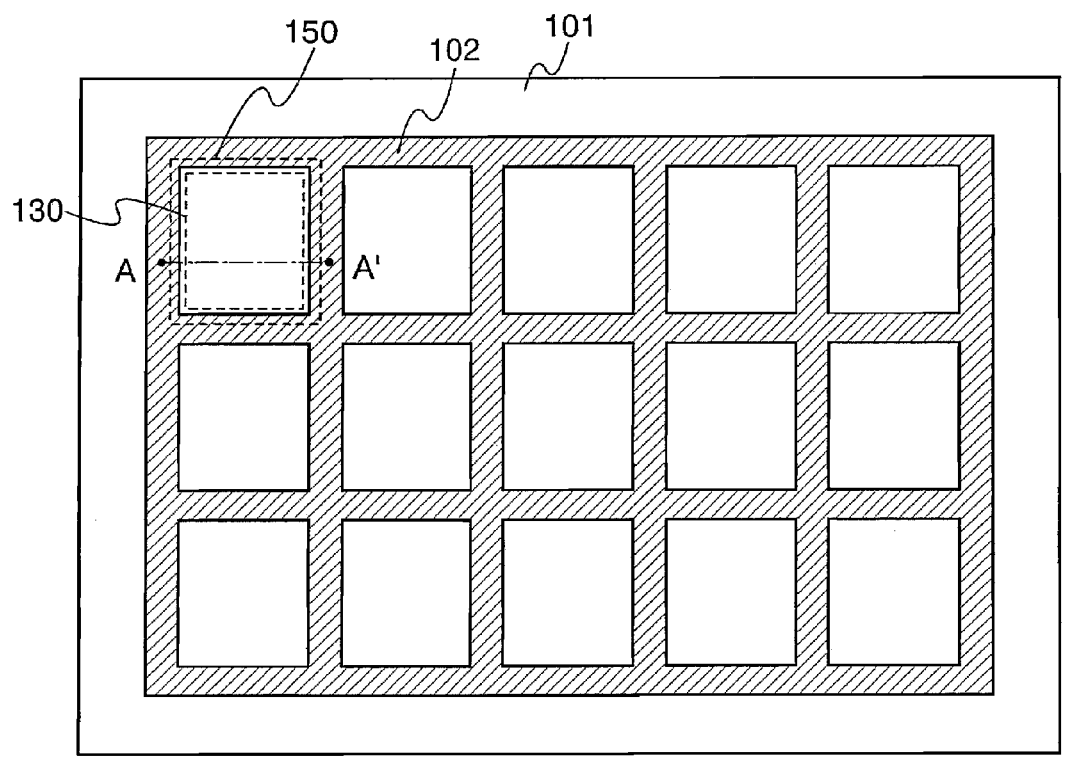
FIGS. 1A and 1B are top views explaining a method for manufacturing a light emitting device according to the present invention.

FIG. 1A is a top view explaining the method for manufacturing the light emitting devices of the invention, while FIGS. 2A to 2D and FIGS. 3A to 3C are cross sectional views explaining the method for manufacturing the light emitting device of the invention. FIG. 2A is a cross sectional view taken along a dashed line A-A' of FIG. 1A.

As shown in FIG. 1A, a first grid-like semiconductor layer 102 extending in rows and columns is formed over a substrate 101. While forming the first grid-like semiconductor layer 102, plural second island-like semiconductor layers 103 are formed inside of regions 130 surrounded by the first grid-like semiconductor layer 102, as shown in FIG. 2A. Here, the second semiconductor layers 103 are formed so as to fabricate transistors. Through the steps as described later, plural light emitting devices 150 each of which is included in each region 130 surrounded by the first semiconductor layer 102 as a unit are formed over a substrate 101. In order to form a pixel portion 131 and driver circuit portions 132a and 132b within each region 130, respective portions are schematically illustrated in the cross sectional views of FIGS. 2A to 2D and FIGS. 3A to 3C.

Although a material for the substrate 101 is not particularly limited here, a substrate made from glass, quartz and the like can be used. An insulating layer 104 covering the substrate 101 may be formed on the substrate 101. The insulating layer 104 may include a single layer or plural layers. Note that impurities from the substrate 101 can be prevented from dispersing into transistors that will be formed later by providing a silicon nitride layer (which may contain several % oxygen) in the insulating layer 104.

After forming a semiconductor layer covering the substrate 101, the semiconductor layer may be processed by etching to form the first semiconductor layer 102 and the second semiconductor layers 103. The semiconductor layer is not particularly limited here, and may be formed by using silicon and the like. Further, the crystallinity of the semiconductor layer is not particularly limited, and a semiconductor layer containing a crystalline component can be employed.

Next, an insulating layer 105 is formed to cover the first semiconductor layer 102 and the second semiconductor layers 103. The insulating layer 105 may include either a single layer or plural layers, and, for example, can comprise silicon oxide or silicon nitride.

In order to control the threshold value of the transistors, an n-type or a p-type impurity may be added to the second semiconductor layers 103 before or after forming the insulating layer 105. For example, phosphorus and the like may be used as the n-type impurity while boron and the like can be used as the p-type impurity. Further, an impurity may also be added to the first semiconductor layer 102 when adding the impurity to the second semiconductor layers 103.

Subsequently, conductive layers 106 serving as gate electrodes are formed over the insulating layer 105 at portions where the second semiconductor layers 103 and the insulating layer 105 are overlapped with one another. Concretely, after forming a conductive layer to cover the insulating film 105, the conductive layer may be processed by etching to form the conductive layers 106. At this moment, the entire surface of the substrate is maintained at an almost constant potential by providing the first semiconductor layer 102. Therefore, the potential deviation is hardly caused in the surface of the substrate when using etching with use of plasma excitation such as dry etching, and hence, the elements are hardly damaged by electrostatic charge. The conductive layers 106 may include a single layer or plural layers. For example, a conductive layer that is well-adhered to the insulating layer 105 may be formed on the insulating layer 105, and a conductive layer with low resistivity may be laminated thereon. The shape of the conductive layers 106 is not particularly limited, and for instance, the sidewalls of the respective conductive layers 106 may have a sloping shape.

Next, an impurity is added to the second semiconductor layers 103 by utilizing the conductive layers 106 as masks. At this moment, an impurity imparting an n-type conductivity such as phosphorus may be doped to form an n-type transistor. Alternatively, an impurity imparting a p-type conductivity such as boron may be added to form a p-type transistor. When adding the n-type impurity, the semiconductor layers that will become constituent elements of p-type transistors may be protected by utilizing masks made from resist and the like so as not to be doped with the n-type impurity. Similarly, when adding the p-type impurity, the semiconductor layers that will become constituent elements of n-type transistors may be protected by utilizing masks made from resist and the like so as not to be doped with the p-type impurity. Alternatively, for example, after adding the n-type impurity to the all semiconductor layers formed over the substrate 101 without using masks made from resist and the like, the p-type impurity may be added to the semiconductor layers that will be the constituent elements of the p-type transistors by adjusting the amount of the p-type impurity so as to counteract the n-type conductivity with the p-type conductivity.

The method for adding the impurity is not particularly limited here. For instance, doping and the like can be employed. The impurity may also be added to the first semiconductor layer 102 together with the second semiconductor layers 103. By adding the impurity to the first semiconductor layer 102, the effect of maintaining the surface of the substrate 101 at a constant potential can further be improved.

According to the above-mentioned steps, the transistors 121a, 121b, 121c and 121d formed by laminating the semiconductor layers, the insulating layer and the conductive layers can be manufactured. The transistors 121a and 121b are, herein, included in the pixel portion 131 and each connected to a light emitting element. The transistor 121c is included in the driver circuit portion 132a whereas the transistor 121d is included in the driver circuit portion 132b. Further, the pixel portion 131 and the driver circuit portions 132a and 132b may include another transistors other than the transistors 121a, 121b, 121c and 121d. A structure of the transistors 121a, 121b, 121c and 121d is not particularly limited, and they may have any of a single drain structure, an LDD structure, another LDD structure in which a LDD and a conductive layer functioning as a gate electrode are overlapped with each other, and the like, respectively. When the transistors are manufactured with the first semiconductor layer 102 formed over the substrate, the steps of manufacturing the transistors 121a, 121b, 121c and 121d are not particularly limited. Therefore, the steps of manufacturing the transistors can appropriately be determined so as to form the transistors 121a, 121b, 121c and 121d with a predetermined structure. Furthermore, all the transistors formed in a light emitting device are not necessary to have a same structure, and the structures of the transistors may be varied separately depending on an intended purpose of each transistor.

Next, an insulating layer 107 is formed to cover the conductive layers 106 and the like. The insulating layer 107 may include a single layer or plural layers. In this embodiment mode, the insulating layer 107 includes an insulating layer 107a and an insulating layer 107b. After forming the insulating layer 107a, the insulating layer 107a is subjected to heat treatment and then the insulating layer 107b is formed to cover the insulating layer 107a. Although the insulating layer 107a is not particularly limited, it is preferably made from a heat resistant substance that can withstand a temperature of 350° C. or more, e.g., an inorganic material such as silicon oxide, silicon nitride, silicon nitride containing several % of oxygen, and silicon oxide containing several % of nitrogen. Although the insulating layer 107b is not particularly limited, it is preferably formed of a layer that is made from a self-planarizing substance such as acrylic, siloxane and polyimide or a layer formed by planarizing a silicon oxide layer or the like by CMP (chemical and mechanical polishing) etc. Further, although the process conditions of the heat treatment are not particularly limited, it is preferable that the heat treatment is performed at a temperature of 350 to 600° C. under an atmosphere filled with a gas such as nitrogen and hydrogen. Furthermore, the timing of the heat treatment is not particularly limited, and the heat treatment may be carried out after forming the insulating layer 107a that is a first layer, after forming the insulating layer 107b that is a second layer or both of after forming the insulating layers 107a and 107b.

Next, contact holes that reach the second semiconductor layers 103 through the insulating layer 107 are formed. The contact holes may be formed by etching the insulating layer 107. In this case, either dry etching or wet etching can be employed as the etching. Also, a combination of the dry etching and wet etching may be employed. For instance, after processing the insulating layer 107b by dry etching, the insulating layer 107a may be processed by wet etching to form the contact holes. Alternatively, both the insulating layers 107a and 107b may be processed by dry etching to form the contact holes.

When forming the contact holes, the entire surface of the substrate 101 is maintained at an almost constant potential since the first semiconductor layer 102 is provided. Accordingly, when forming the contact holes by etching with use of plasma excitation such as dry etching, the potential deviation is hardly caused within the surface of the substrate, and hence, the elements are hardly damaged by the electrostatic charge.

Next, wirings 108 and 109 and the like are formed. Concretely, after forming a conductive layer, the conductive layer may be processed by etching to form the wirings 108 and 109. Note that a material for the conductive layer is not particularly limited, and the conductive layer may include a single layer or plural layers. Preferably, the conductive layer is formed so as to include a layer made from a substance with low resistivity such as aluminum. When the wirings 108 and 109 have a lamination structure formed by sandwiching an aluminum layer between titanium nitride layers, it is possible to prevent the aluminum layer of each wiring from being in contact with the second semiconductor layers 103 in positions where the wirings and the second semiconductor layers are connected to one another. Further, it is also possible to prevent the aluminum layer from being corroded when using an acidic solution for forming an electrode of a light emitting element later. In the case where the wirings 108 and the first semiconductor layer 102 are overlapped and in contact with each other as shown in this embodiment mode, the first semiconductor layer 102 may also be etched in the step of etching the wirings 109. Note that the wirings 109 serve to supply current to light emitting elements. The upper part of the first semiconductor layer 102 can be utilized efficiently as a region for leading the wirings 109 as shown in the embodiment mode. Note that the wirings 108 and the first semiconductor layer 102 are not necessarily to be in contact with one another as well as the present embodiment mode, and an insulating layer may be provided therebetween. The wirings 108 serve to transmit signals to the respective transistors within the region 130 surrounded by the first semiconductor layer 102. The wirings 109 are connected to the second semiconductor layers 103 through the contact holes that are previously formed.

When the insulating layer 107 is made from a substance with a high moisture permeability, a conductive layer for covering sides of the insulating layer 107 is preferably formed along with the formation of the wirings 108 and 109. This can prevent ingress of moisture into the light emitting element from the outside of the light emitting device through the insulating layer 107.

An electrodes 110 of the light emitting element is next formed. In this case, the electrode 110 of the light emitting element is partly overlapped with at least the wirings 109 so that the electrodes 110 of the light emitting element can be electrically connected to the wirings 109. The electrodes 110 of the light emitting element is not particularly limited. For example, after forming a conductive layer by using a conductive material that can transmit visible light, the conductive layer can be processed by etching to form the electrodes 110. Although the conductive material that can transmit visible light is not particularly limited, indium tin oxide (ITO), ITO containing silicon oxide, IZO (indium zinc oxide) formed by mixing 2 to 20% zinc oxide (ZnO) and indium oxide and the like can be employed. Either wet etching or dry etching can be used as the etching. For instance, a weak acidic solution can be used when etching the ITO and the like. The electrode 110 can also be formed by using aluminum and the like as substitute for the conductive material that can transmit visible light. Note that the aluminum may include alkali metal (such as lithium (Li, alkali earth metal or magnesium (Mg).

A partition wall layer 111 with an opening is next formed. The partition wall layer 111 preferably has a shape with a radius of curvature that is continuously varied at side portions. Additionally, the partition wall layer 111 is formed such that the electrodes 110 of the light emitting element are exposed from the opening. A substance of the partition wall layer 111 is not particularly limited. For example, acrylic, polyimide, siloxane (which is a substance having a skeleton structure formed by silicon (Si)-oxygen (O) bonds and containing at least hydrogen in its organic group), resist and the like can be used. Photosensitive acrylic, polyimide and resist may be used here. Note that the sidewalls of the insulating layer 107 is not necessary to be covered with the partition wall layer 111.

A light emitting layer 112 is next formed to cover the electrodes 110 of the light emitting element. The light emitting layer 112 is not particularly limited as far as a layer containing a light emitting substance. For instance, the light emitting layer 112 may include a single layer made from a substance with a superior light emitting property and an excellent carrier transporting property, or a single layer or plural layers containing a substance with a superior light emitting property and a substance with an excellent carrier transporting property. A substance for forming the light emitting layer 112 is not particularly limited, and one or both of organic and inorganic substances can be employed.

An electrode 113 of the light emitting element is next formed. The electrode 113 of the light emitting element is not particularly limited, and it can be formed of aluminum or the above-mentioned conductive substance that can transmit visible light. Note that the aluminum may include alkali metal such as lithium (Li) and magnesium or alkali earth metal.

Preferably, the thicknesses, materials, lamination structures and the like of the electrodes 110 and 113 for the light emitting element are controlled such that at least one of the electrodes can transmit visible light.

According to the foregoing steps, a light emitting element 114 including the light emitting layer 112 sandwiched between the electrodes 110 and 113 of the light emitting element can be manufactured.

After forming the light emitting element 114, a protective layer 115 may be provided so as to prevent ingress of moisture and the like into the light emitting element. The protective layer 115 may include a single layer or plural layers and can be formed of silicon nitride or the like.

Figure 1B:
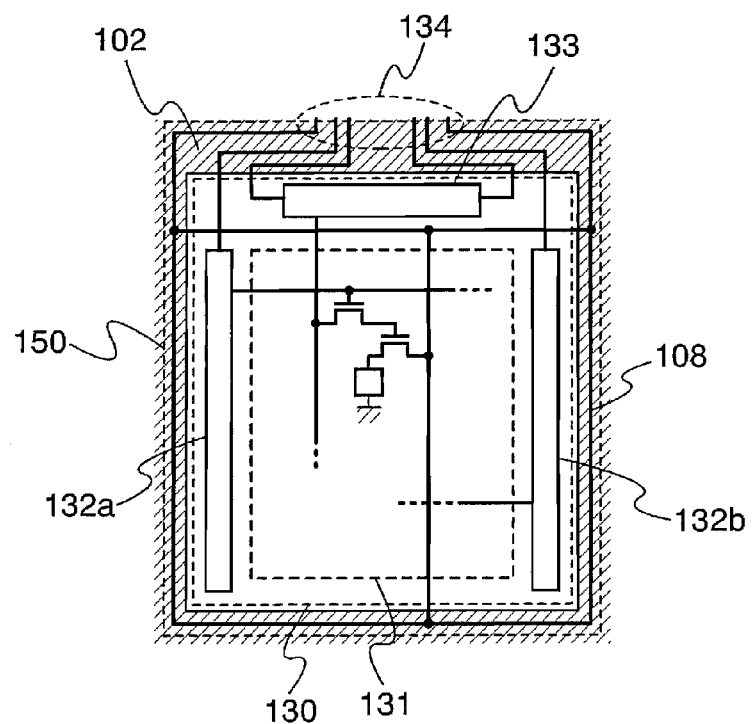

Through the above-mentioned steps, a plurality of light emitting devices each of which includes the pixel portion 131, the driver circuit portions 132a, 132b and 133, the wirings 108 formed in the periphery of the pixel portion and the driver circuit portions, a connection terminal 134 and the like can be manufactured over the substrate 101 as shown in FIG. 1B. In each pixel portion 131, plural pixels including the transistors and the light emitting elements are aligned in rows and columns. Note that the first semiconductor layer 102 is illustrated in FIG. 1B so as to show a positional relation between constituent elements (the pixel portion 131, the driver circuit portions 132a, 132b and 133, the wirings 108 provided in the periphery of the pixel portion and the driver circuit portions, the connection terminal 134 and the like) included in each light emitting device and the first semiconductor layer 102. Although one pixel including two transistors and one light emitting element is illustrated in FIG. 1B, the pixel structure is not limited thereto.

In the above-mentioned method for manufacturing the light emitting devices, a short ring may be utilized so as to reduce damage to the elements due to the electrostatic charge, which may be caused after forming the wirings 108 and 109.

Next, the substrate 101 is cut (i.e. divided) into each light emitting device. In this case, a layer is preferably not laminated over cutting sections along which the substrate 101 is divided into each light emitting device. In particular, it is preferable that a conductive layer, or a layer made from an organic material is not laminated over the cutting sections.

The divided substrates 101 and substrates 140 are attached to each other with a sealing material 141 so that light emitting layers are sealed therebetween. At this moment, the wirings 108 covering the insulating layer 107 is preferably covered with the sealing material 141. Further, the sealing material 141 preferably contains a substance with a low moisture permeability such as bisphenol A liquid resin, bisphenol A solid resin, epoxy resin containing bromine, bisphenol F resin, bisphenol AD resin, phenol resin, cresol resin, novolac resin, cyclic aliphatic epoxy resin, epibis epoxy resin, glycidyl ether resin, glycidyl amine resin, heterocyclic epoxy resin and modified epoxy resin. This can inhibit ingress of moisture into the light emitting element through the insulating layer 107 when the insulating layer 107 or the partition wall layer 111 is made from a substance with a high moisture permeability. Each of the interior of the light emitting devices after the sealing step, i.e., the inner portion surrounded by the substrate 101, the substrate 140 and the sealing material 141 may be filled with an inert gas such as nitrogen or a resin material with a low moisture permeability etc. Or, the inner portion interior may be evacuated. Alternatively, a hygroscopic substance may be fixed in the interior of the light emitting device after the sealing step to absorb moisture intruding into the interior thereof so that deterioration of the light emitting element due to moisture or the like can be prevented. The hygroscopic substance is not particularly limited. For instance, calcium oxide can be employed. Also, the method for fixing the hygroscopic substance is not particularly limited. For example, after providing a depression portion in a part of the substrate 140 and filling a substance that contains a granular calcium oxide and a fixing agent in the depression portion, the substance is cured so as to be fixed to the interior of the light emitting device. Note that the fixing agent is also not particularly limited, and for example, ester acrylate or the like can be employed. Additionally, the substrate 140 is not particularly limited, and a substrate made of glass, quartz, plastic or the like can be used.

Each of the light emitting devices manufactured above has the first grid-like semiconductor layer 102 extending in rows and columns over the substrate 101 so as to maintain the substrate 101 at a constant potential during the formation of the transistors 121a, 121b, 121c and 121d and the wirings 108 and 109. Therefore, the deterioration of the elements due to the electrostatic charge, which is easily caused in the process utilizing plasma excitation and the like, can be suppressed in the present light emitting devices. The present invention is extremely effective in the case of manufacturing a plurality of light emitting devices from a large size substrate with an area of 600 mm×720 mm or more.

Embodiment Mode 2

The method for manufacturing the light emitting devices as described in Embodiment Mode 1 and another mode of the present invention will be described in the present embodiment mode with reference to FIGS. 4A to 4C and FIGS. 5A to 5C.

A first grid-like semiconductor layer 202 extending in rows and columns is formed over a substrate 201 as well as the first semiconductor layer 102 as shown in Embodiment Mode 1. While forming the first semiconductor layer 202, plural second island-like semiconductor layers 203 are formed inside of each region 230 surrounded by the first semiconductor layer 202 in the same manner as the second island-like semiconductor layers 103 as shown in Embodiment Mode 1. The second semiconductor layers 203 are formed to fabricate transistors. Through steps as described later, plural light emitting devices each of which is included in one region 230 surrounded by the first semiconductor layer 202 as a unit are formed over the substrate 201. Note that respective portions are schematically illustrated in the cross sectional views of FIGS. 4A to 4C and FIGS. 5A to 5C so as to manufacture a pixel portion 231, driver circuit portions 232a and 232b and the like inside each of the region 230.

The substrate 201 is not particularly limited, and the same material used for the substrate 101 as explained in Embodiment Mode 1 can be employed here. An insulating layer 204 covering the substrate 201 may be formed on the substrate 201. Similarly, the insulating layer 204 is not particularly limited, the same material used for the insulating layer 104 of Embodiment Mode 1 may be used.

After forming a semiconductor layer covering the substrate 201, the semiconductor layer may be processed by etching to form the first semiconductor layer 202 and the second semiconductor layers 203. The semiconductor layer is not particularly limited, and silicon and the like can be used. Also, the crystallinity of the semiconductor layer is not particularly limited, and a semiconductor layer containing a crystalline component can be used.

An insulating layer 205 is next formed to cover the first semiconductor layer 202 and the second semiconductor layers 203. The insulating layer 205 is not particularly limited, and it may be formed in the same manner as the insulating layer 105 shown in Embodiment Mode 1.

In order to control the threshold value of the transistors, an n-type or a p-type impurity may be added to the second semiconductor layers 203 before or after forming the insulating layer 205. For example, phosphorus and the like may be used as the n-type impurity while boron and the like can be used as the p-type impurity. Further, an impurity may also be doped into the first semiconductor layer 202 when adding the impurity to the second semiconductor layers 203.

Subsequently, conductive layers 206 that serves as gate electrodes are formed over the insulating layer 205 at portions where the second semiconductor layers 203 and the insulating layer 205 are overlapped with one another. Concretely, after forming a conductive layer to cover the insulating film 205, the conductive layer may be processed by etching to form the conductive layers 206. At this moment, the entire surface of the substrate 201 is maintained at an almost constant potential by providing the first semiconductor layer 202. Therefore, the potential deviation is hardly caused in the surface of the substrate when using etching with use of plasma excitation such as dry etching; and hence, the elements are hardly damaged by electrostatic charge. The conductive layers 206 may, herein, include either a single layer or plural layers. For example, a conductive layer that is well-adhered to the insulating layer 205 may be formed so as to be in contact with the insulating layer 205, and a conductive layer with low resistivity may be laminated thereon. The shape of the conductive layers 206 is not particularly limited, and for instance, the sidewalls of the conductive layers 206 may have a sloping shape.

Next, an impurity is added to the second semiconductor layers 203 by utilizing the conductive layers 206 as masks. In this case, an impurity imparting an n-type conductivity such as phosphorus may be added to form an n-type transistor. Alternatively, an impurity imparting a p-type conductivity such as boron may be added to form a p-type transistor. When adding the n-type impurity, the semiconductor layers that will become constituent elements of p-type transistors may be protected by using masks made from resist and the like so as not to be doped with the n-type impurity. Similarly, when adding the p-type impurity, the semiconductor layers that will become constituent elements of n-type transistors may be protected by using masks made from resist and the like so as not to be doped with the p-type impurity. Alternatively, for example, after doping the n-type impurity to the all semiconductor layers formed over the substrate 201 without using resist masks and so on, the p-type impurity may be added to the semiconductor layers that will be the constituent elements of the p-type transistors by adjusting the amount of the p-type impurity so as to counteract the n-type conductivity with the p-type conductivity.

The method for adding the impurity is not particularly limited. For example, doping and the like can be used. The impurity may also be added to the first semiconductor layer 202 along with the second semiconductor layers 203. By adding the impurity to the first semiconductor layer 202, the effect of maintaining the substrate 201 at a constant potential can further be improved.

According to the above-mentioned steps, transistors 221a, 221b, 221c and 221d formed by laminating the semiconductor layers, the insulating layer and the conductive layers can be manufactured. The transistors 221a and 221b are, herein, included in the pixel portion 231 and each will be connected to a light emitting element. The transistor 221c is included in the driver circuit portion 232a whereas the transistor 221d is included in the driver circuit portion 232b. Further, the pixel portion 231 and the driver circuit portions 232a and 232b may include another transistors other than the transistors 221a, 221b, 221c and 221d. A structure of the transistors 221a, 221b, 221c and 221d is not particularly limited, and they can have any of a single drain structure, an LDD structure, another LDD structure in which a LDD and a conductive layer functioning as a gate electrode are overlapped with each other, and the like, respectively. When the transistors are manufactured with the first semiconductor layers 202 formed over the substrate, the step of manufacturing the transistors 221a, 221b, 221c and 221d is not particularly limited. Therefore, the step of manufacturing the transistors may appropriately be determined so as to form the transistors 221a, 221b, 221c and 221d with a predetermined structure. Furthermore, the all transistors formed in a light emitting device are not necessary to have a same structure, and structures of the transistors may be varied separately depending on the intended purpose of the transistors.

Next, an insulating layer 207 is formed to cover the conductive layers 206 and the like. The insulating layer 207 may include a single layer or plural layers. In this embodiment mode, the insulating layer 207 includes an insulating layer 207a and an insulating layer 207b. Concretely, after forming the insulating layer 207a, the insulating layer 207b is further formed to cover the insulating layer 207a, and then the both insulating layers are subjected to heat treatment. Although the insulating layers 207a and 207b are not particularly limited, they are preferably made from heat resistant substrates that can withstand a temperature of 350° C. or more, e.g., an inorganic material such as silicon oxide, silicon nitride, silicon nitride containing several % of oxygen and silicon oxide containing several % of nitrogen. Although the process conditions of the heat treatment are not particularly limited, it is preferable that the heat treatment be performed at a temperature of 350 to 600° C. under an atmosphere filled with a gas such as nitrogen and hydrogen. Furthermore, the timing of the heat treatment is not particularly limited, and the heat treatment may be carried out after forming the insulating layer 207a that is a first layer, after forming the insulating layer 207b that is a second layer or both of after forming the insulating layers 207a and 207b.

Next, contact holes that reach the second semiconductor layers 203 through the insulating layer 207 are formed. The contact holes may be formed by etching the insulating layer 207. In this case, either dry etching or wet etching can be employed as the etching. Also, a combination of the dry etching and wet etching may be employed. For example, after the insulating layer 207b is dry-etched, the insulating layer 207a is wet-etched to form the contact holes. Alternatively, both the insulating layers 207a and 207b may be dry-etched to form the contact holes.

When forming the contact holes, the entire surface of the substrate 201 is maintained at an almost constant potential since the first semiconductor layer 202 is provided. Accordingly, when forming the contact holes by etching with use of plasma excitation such as dry etching, the potential deviation is hardly caused within the substrate, and hence, the elements are hardly damaged by the electrostatic charge.

Next, wirings 208 and 209 and the like are formed. After forming a conductive layer, the conductive layer may be processed by etching to form the wirings 208 and 209. Alternatively, after forming the conductive layer, heat treatment may be carried out and then sintering may further be performed. Note that a material for the conductive layer is not particularly limited, and the conductive layer may include a singe layer or plural layers. Preferably, the conductive layer is formed so as to include a layer made from a substance with low resistivity such as aluminum. When the wirings 208 and 209 have a lamination structure formed by sandwiching an aluminum layer between titanium nitride layers or the like, it is possible to prevent the aluminum layer from being in contact with the second semiconductor layers 203 in positions where the wirings and the second semiconductor layers are overlapped with one another. Further, the aluminum layer can be prevented from being corroded when using an acidic solution for forming an electrode of a light emitting element later. Note that the wirings 208 serve to supply current to a light emitting element. The wirings 208 and the first semiconductor layer 202 are overlapped with each other. Accordingly, the upper part of the first semiconductor layer 202 can effectively be utilized as a region for leading the wirings 208. The wirings 209 serve to transmit signals to the respective transistors within the region 230 surrounded by the first semiconductor layer 202. The wirings 209 are connected to the second semiconductor layers 203 through the contact holes that are previously formed.

An insulating layer 210 is next formed to cover the wirings 209. Although the insulating layer 210 is not particularly limited, it is preferably formed by a layer made from a self-planarizing substance such as acrylic, siloxane and polyimide, or a layer formed by planarizing a silicon oxide layer or the like by CMP (chemical and mechanical polishing) etc. When the insulating layer 210 is made from siloxane, heat treatment for baking the insulating layer 210 may be carried out.

Contact holes that reach the wirings 209 through the insulating layer 210 are next formed. While forming the contact holes, openings are formed such that the wirings 208 are partly exposed. The contact holes and the like may be formed by etching the insulating layer 210. In this case, either dry etching or wet etching may be employed. Alternatively, a combination thereof may also be employed.

When forming the contact holes, the entire surface of the substrate 201 is maintained at an almost constant potential since the first semiconductor layer 202 is provided. Accordingly, when forming the contact holes by etching with use of plasma excitation such as dry etching, potential deviation is hardly caused within the substrate, and hence, the elements are hardly damaged by the electrostatic charge.

Subsequently, electrodes 211 of the light emitting elements that reaches the wirings 209 via the contact holes passing through the insulating layer 210 are formed. The electrodes 211 of the light emitting elements are not particularly limited. For example, after forming a conductive layer by using a conductive material that can transmit visible light, the conductive layer is processed by etching to form the electrodes 211. Although the conductive material that can transmit visible light is not particularly limited, indium tin oxide (ITO), ITO containing silicon oxide, IZO (indium zinc oxide) formed by mixing 2 to 20% zinc oxide and indium oxide and the like can be used. Either wet etching or dry etching can be used as the etching. For instance, a weak acidic solution can be used when etching the ITO and the like. The electrodes 211 can also be formed by using aluminum and the like as substitute for the conductive material that can transmit visible light.

Note that the aluminum may include alkali metal such as lithium (Li) and magnesium or alkali earth metal.

A partition wall layer 212 with openings is next formed. The partition wall layer 212 preferably has a shape with a radius of curvature that is continuously varied at side portions. Further, the partition wall layer 212 is formed such that the electrodes 211 of the light emitting element are exposed from the openings. A substance of the partition wall layer 212 is not particularly limited. For example, acrylic, polyimide, siloxane (which is a substance having a skeleton structure formed by silicon (Si)-oxygen (O) bonds and containing at least hydrogen in its organic group), resist or the like can be employed. Photosensitive acrylic, polyimide and resist may be used here. Note that the sides of the insulating layer 210 may be covered with the partition wall layer 212 as well as FIG. 3B.

A light emitting layer 213 is formed to cover the electrodes 211 of the light emitting element. The light emitting layer 213 is not particularly limited, and the same material used for the light emitting layer 112 as explained in Embodiment Mode 1 can be employed.

An electrode 214 of the light emitting element is next formed. The electrode 214 of the light emitting element is not particularly limited, and can be formed of aluminum or the above-described conductive material that can transmit visible light. Note that aluminum may include the alkali metal (such as lithium (Li)), alkali earth metal or magnesium (Mg).

Preferably, the thicknesses, materials, lamination structures and the like of the electrodes 211 and 214 for the light emitting element are controlled so that at least one of the electrodes 211 and 214 can transmit visible light.

According to the above-mentioned steps, a light emitting element 215 including the light emitting layer 213 sandwiched between the electrodes 211 and 214 of the light emitting element can be manufactured.

After forming the light emitting element 215, a protective layer 216 may be provided so as to prevent ingress of moisture and the like into the light emitting element. The protective layer 216 may include a single layer or plural layers and can be formed of silicon nitride or the like.

Through the above-described steps, a plurality of light emitting devices each of which includes the pixel portion 231, the driver circuit portions 232a and 232b the wirings 208 formed in the periphery of the pixel portion and the driver circuit portions, a connection terminal and the like can be manufactured over the substrate 201. In each pixel portion 231, plural pixels including transistors and light emitting elements are aligned in rows and columns. The positional relation between constituent elements (the pixel portion 231, the driver circuit portions 232a and 232b, the wirings 208 provided in the periphery of the pixel portion and the driver circuit portions, the connection terminal and the like) included in each light emitting device and the first semiconductor layer 202 is identical to the one as shown in FIG. 1B of Embodiment Mode 1. Note that the configuration of the light emitting devices is not limited to that of FIG. 1B.

The substrate 201 is cut (i.e. divided) into each light emitting device. In this case, a layer is preferably not laminated over cutting sections along which the substrate 201 is divided into the respective light emitting devices. In particular, it is preferable that a conductive layer, or a layer made from an organic material is not laminated over the sections.

The divided substrates 201 and substrates 240 are attached to each other with a sealing material 241 so that respective light emitting layers are encapsulated therebetween. At this moment, the openings formed in the insulating layers 210 are preferably filled with the sealing material 241. Further, the sealing material 241 preferably contains a substance with a low moisture permeability such as bisphenol A liquid resin, bisphenol A solid resin, epoxy resin containing bromine, bisphenol F resin, bisphenol AD resin, phenol resin, cresol resin, novolac resin, cyclic aliphatic epoxy resin, epibis epoxy resin, glycidyl ether resin, glycidyl amine resin, heterocyclic epoxy resin and modified epoxy resin. This can inhibit ingress of moisture into the light emitting element 215 through the insulating layer 210 when the insulating layer 210 or the partition wall layer 212 is made from a substance with a high moisture permeability. The interior of the light emitting device after the sealing step, i.e., the inner portion surrounded by the substrate 201, the substrate 240 and the sealing material 241 may be filled with an inert gas such as nitrogen, a resin material with a low moisture permeability or the like. Or, the inner portion may be evacuated. Alternatively, a hygroscopic substance may be fixed in the interior of the light emitting device after the sealing step to absorb moisture and the like intruding into the interior thereof so that deterioration of the light emitting element due to moisture and the like can be prevented. The hygroscopic substance is not particularly limited. For instance, calcium oxide can be employed. Also, the method for fixing the hygroscopic substance is not particularly limited. For example, after providing a depression portion in a part of the substrate 240 and filling a substance that contains a granular calcium oxide and a fixing agent in the depression portion, the substance is cured so as to be fixed to the interior of the light emitting device. Note that the fixing agent is also not particularly limited, and for example, ester acrylate or the like can be employed. Additionally, the substrate 240 is not particularly limited, and a substrate made of glass, quartz, plastic or the like can be used.

Each of the light emitting devices manufactured above includes the first grid-like semiconductor layer 202 extending in rows and columns over the substrate 201 so as to maintain the surface of the substrate 201 at a constant potential during the fabrication of the light emitting devices. Therefore, the deterioration of the elements due to the electrostatic charge, which is easily caused in the process utilizing plasma excitation, can be reduced in the present light emitting devices. The present invention is extremely effective in the case where a large size substrate with an area of 600 mm×720 mm or more is employed so as to form plural light emitting devices by using one substrate.

Embodiment Mode 3

Light emitting devices manufactured according to the present invention as shown in Embodiment Modes 1 and 2 will be described in the present embodiment mode.

This embodiment mode will describe modes of the light emitting devices formed according to the present invention. Note that configurations of the light emitting devices according to the invention and substances of the light emitting devices are not limited to the present embodiment mode.

Figure 3A:
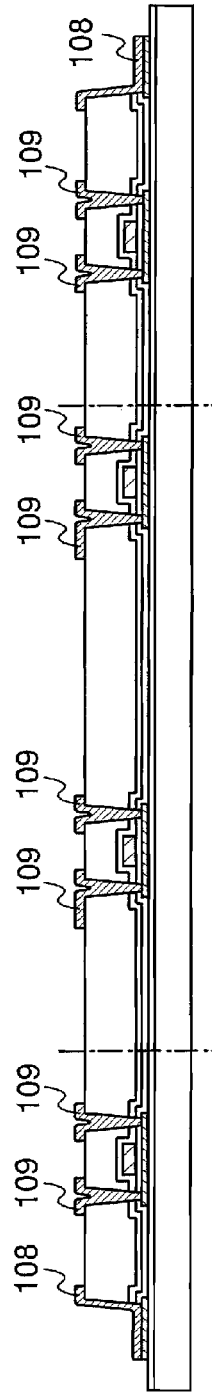
FIGS. 3A to 3C are cross sectional views explaining a method for manufacturing a light emitting device according to the invention.
Figure 3B:
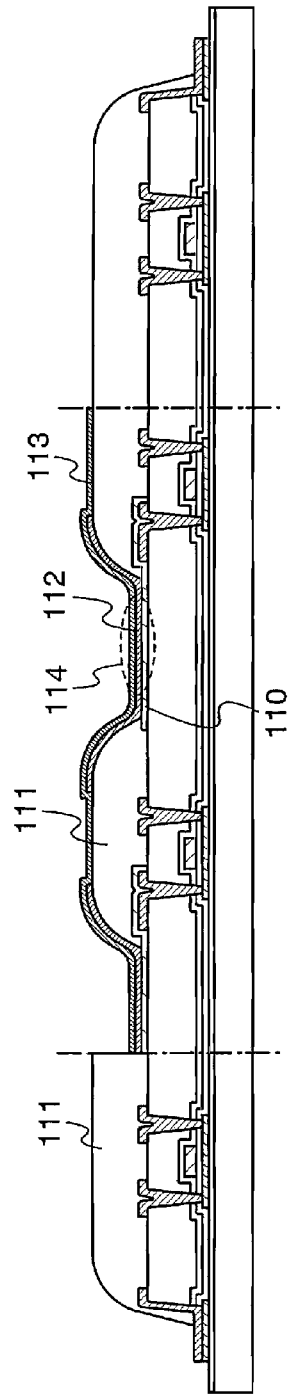
Figure 3C:
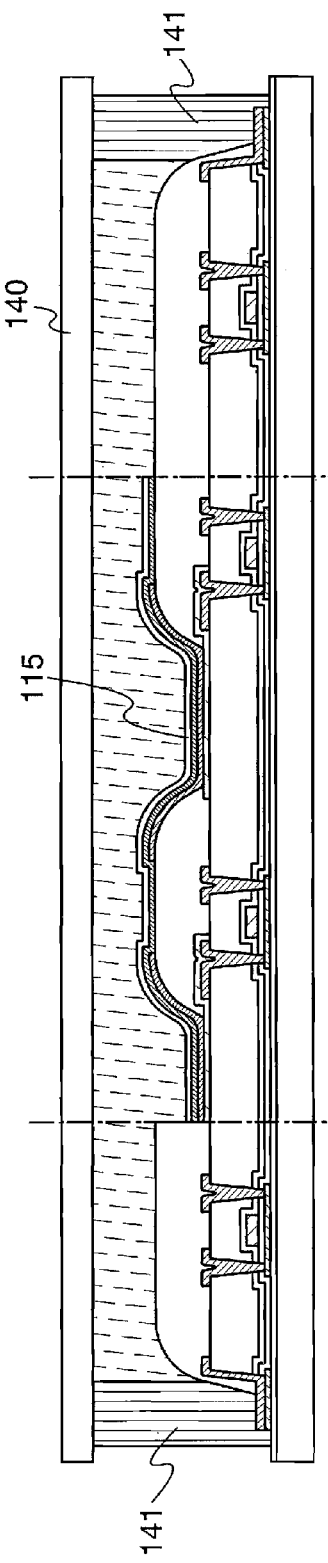

In the light emitting devices as shown in FIGS. 3C and 5C, the light emitting layer 112 that is a constituent element of the light emitting element 114 and the light emitting layer 213 that is a constituent element of the light emitting element 215 include plural layers, respectively. The plural layers are formed by combining layers made from substances selected from substances with excellent carrier transporting properties and excellent carrier injecting properties. The plural layers partly contain a substance with an excellent light emitting property. The substance included in the light emitting layers 112 and 213 may be either an organic substance or an inorganic substance. In the case of the organic substance, it may be either a low molecular weight organic substance or a high molecular weight organic material.

With respect to light emitting substances, the following substances can be used: 4-dicyanomethylene-2-methyl-6-(1, 1,7,7-tetramethyl-julolidy 1-9-enyl)-4H-pyran (abbreviation: DCJT); 4-dicyanomethylene-2-t-butyl-6-(1,1,7,7-tetramethyl-julolid yl-9-enyl)-4H-pyran (abbreviation: DPA); periflanthene; 2,5-dicyano-1,4-bis(10-methoxy-1,1,7,7-tetramethyl-julolidy 1-9-enyl)benzene; N,N'-dimethylquinacridone (abbreviation: DMQd); coumarin 6; coumarin 545T; tris(8-quinolinolate) aluminum (abbreviation: $Alq_3$); 9,9'-biantryl; 9,10-diphenylanthracene (abbreviation: DPA); 9,10-bis(2-naphthyl)anthracene (abbreviation: DNA); and the like. Also, another substances can be employed.

Further, triplet excited light emitting substances including metal complexes and the like may be used for a light emitting layer in addition to the foregoing singlet excited light emitting substances. For example, pixels emitting red light in which half-life period of the luminance is relatively shorter than pixels emitting green and blue lights are formed by a triplet excited light emitting substance, and the pixels emitting green and blue lights are formed by singlet excited light emitting substances. Since the triplet excited light emitting material has an excellent light emitting efficiency, it has a feature of requiring low power consumption in order to obtain a same level of luminance as compared with the singlet excited light emitting substances. That is, when the pixels for emitting red light are formed by the triplet excited light emitting material, a small amount of current flowing through the light emitting element is required, thereby improving the reliability. To reduce power consumption, in turn, pixels emitting red and green lights may be formed of the triplet excited light emitting materials, while pixels emitting blue light may be formed of a singlet excited light emitting material. In the case where light emitting elements that emit green lights, which has high visibility with respect to human eyes, are also formed of the triplet excited light emitting material, power consumption can be further reduced.

As an example of the triplet excited light emitting substances, there is one that uses a metal complex as a dopant. In particular, a metal complex with platinum, which is a third transition element, as its central metal, a metal complex with iridium as its central metal and the like are known. The triplet excited light emitting substances are not limited to these compounds, and it is possible to employ a compound having an above-mentioned structure and including an element that belongs to groups 8 to 10 of the periodic table as its central metal.

With respect to substances with excellent electron transporting properties among substances with superior carrier transporting properties, for example, metal complexes having quinoline skeleton or benzoquinoline skeleton such as tris(8-quinolinolate)aluminum (abbreviation: $Alq_3$); tris(5-methyl-8-quinolinolate)aluminum (abbreviation: $Almq_3$); bis(10-hydroxybenzo[h]quinolinato)beryllium (abbreviation: $BeBq_2$); and bis(2-methyl-8-quinolinolate)-4-phenylphenolate-aluminum (abbreviation: BAlq) can be given. As substances having superior hole transporting properties, for example, the following substances can be cited: aromatic amine (i.e., one having a benzene ring-nitrogen bond) based compounds such as 4,4'-bis[N-(1-naphthyl)-N-phenyl-amino]-biphenyl (abbreviation: α-NPD); 4,4'-bis[N-(3-methylphenyl)-N-phenyl-amino]-biphenyl (abbreviation: TPD); 4,4',4''-tris(N,N-diphenyl-amino)-triphenylamine (abbreviation: TDATA); and 4,4',4''-tris[N-(3-methylphenyl)-N-phenyl-amino]-triphenylamine (abbreviation: MTDATA). With respect to substances having extremely superior electron injecting properties among the substances with excellent carrier injecting properties, compounds of alkali metal or alkali earth metal such as lithium fluoride (LiF), cesium fluoride (CsF) and calcium fluoride ($CaF_2$) can be cited. In addition, a mixture of a substance having a high electron transportation property such as $Alq_3$ and alkali earth metal such as magnesium (Mg) may be used. With respect to substances having the superior hole injecting properties, for example, metal oxide such as molybdenum oxide (MoOx), vanadium oxide (VOx), ruthenium oxide (RuOx), tungsten oxide (WOx) and manganese oxide (MnOx) can be cited. Besides, phthalocyanine based compounds such as phthalocyanine (abbreviation: $H_2Pc$) and copper phthalocyanine (CuPC) can be mentioned. Further, a high molecular weight material mixing polystyrenesulfonic acid (PSS) that is a substance with the excellent hole injecting/transporting properties and polyethylene dioxythiophene) (PEDOT) and the like can be used.

As compared with the low molecular weight organic light emitting materials, the high molecular weight organic light emitting materials have higher physical strength, which results in more durable elements. In addition, since the high molecular weight organic light emitting materials can be formed by application, an element can be formed relatively easily.

As specific examples of a semiconductor layer containing a crystalline component that can be used as the second semiconductor layers 103 or the second semiconductor layers 203, single crystalline/polycrystalline silicon, silicon germanium and the like can be cited. These substances may be formed by laser crystallization. For example, they may be formed by crystallization with solid phase growth using nickel etc. Also, they may be formed by both laser crystallization and solid phase growth. In addition, a semiamorphous semiconductor can be used as the second semiconductor layers 103 and 203.

The semiamorphous semiconductor has an intermediate structure between an amorphous structure and a crystalline structure (also including a single crystalline structure and a polycrystalline structure), and a third condition that is stable in term of free energy, and further includes a crystalline region having a short range order along with lattice distortion. A crystal region with a size of 0.5 to 20 nm can be observed in at least a part of the semiamorphous semiconductor film. Raman spectrum originated L-O phonon is shifted toward lower wavenumbers than 520 $cm^{-1}$. The diffraction peaks of (111) and (220), which are believed to be derived from Si crystal lattice, are observed in the semiamorphous semiconductor by X-ray diffraction. The semiamorphous semiconductor contains hydrogen or halogen of at least 1 atom % or more as a neutralizing agent for dangling bonds. The semiamorphous semiconductor is also referred to as a microcrystalline semiconductor. The semiamorphous semiconductor is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$, and the like can be used. The silicide gas may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less, preferably, 100 to 250° C. With respect to impurity elements contained in the film, each concentration of impurities for atmospheric constituents such as oxygen, nitrogen and carbon is preferably set to be $1\times10^{20}$ atoms/$cm^3$ or less. In particular, the oxygen concentration is set to be $5\times10^{19}$ atoms/$cm^3$ or less, preferably, $1\times10^{19}$ atoms/ cm³ or less. The mobility of a TFT (thin film transistor) using the semiamorphous semiconductor is approximately 1 to 10 cm²/Vsec.

In the light emitting elements 114 and 215, the electrodes 110 and 211 of the light emitting, elements may serve as anodes and the electrodes 113 and 214 may serve as cathodes, respectively. Alternatively, the electrodes 110 and 211 thereof may serve as cathodes while the electrodes 113 and 214 may serve as anodes. In the former case, the transistors connected to the respective light emitting elements are p-channel transistors. Or, in the latter case, the transistors connected to the respective light emitting elements are n-channel transistors.

In the pixel portions of the light emitting devices according to the present invention, plural pixels including the above-mentioned light emitting elements 114 and 215, and transistors for driving the light emitting elements are arranged in matrix form. Note that light emitting layers having different light-emitting wavelength bands may be formed in each pixel so as to perform color display. Typically, light emitting layers corresponding to respective colors of R (red), G (green) and B (blue) are formed. In this case, when a filter (a colored layer) that transmits lights of the wavelength bands is provided at a side of the light emitting device through which light generated from the light emitting layer is emitted, color purity can be improved and specular reflexion (reflection) of a pixel portion can be prevented. By providing the filter (colored layer), a circular polarizing plat etc., which has conventionally been required, can be eliminated. Therefore, loss of light emitted from the light emitting layers can be reduced. Furthermore, change in color tone, that is caused in the case where a pixel portion (a display screen) is seen obliquely, can be further reduced.

A configuration with a light emitting layer capable of emitting monochromatic light, white light for example, can be achieved instead of performing a color display by providing the light emitting layers corresponding to respective colors. When using a white light emitting material, a color display can be achieved by providing filters (colored layers) that transmits light of a certain wavelength toward a light emitting direction of a pixel.

In order to form a light emitting layer that emits white light, for example, white light emission can be obtained by sequentially laminating $Alq_3$, $Alq_3$ partially doped with Nile red, p-EtTAZ and TPD (aromatic diamine) by using vapor deposition. Also, when a light emitting layer is formed by applying a liquid using spin coating, the light emitting layer is preferably baked by vacuum heating after application. For example, an aqueous solution of polyethylene dioxythiophene)/poly (styrenesulfonic acid) (PEDOT/PSS) may be applied over the entire surface of the substrate and baked. Afterwards, a solution of polyvinyl carbazole (PVK) doped with a pigment (such as 1,1,4,4-tetraphenyl-1,3-butadiene (TPB), 4-dicyanomethylene-2-methyl-6-(p-dimethylamino-styryl)-4H-pyran (DCM1), Nile red and coumarin 6) may then be applied over the entire surface thereof and baked.

A light emitting layer may be formed to include a single layer instead of the above-described light emitting layers including the plural layers. In this case, 1,3,4-oxadiazole derivative (PBD) may be dispersed in polyvinyl carbazole (PVK). In addition, white light emission can be obtained by dispersing 30 wt % PBD and dispersing a suitable amount of four kinds of pigments (TPB, coumarin 6, DCM1 and Nile red).

When the light emitting element, which is a constituent element of the light emitting device according to the present invention, is applied with a forward bias voltage, it can emit light. Pixels of a display device formed by using a light emitting element can be driven by an active matrix method. In either case, each pixel emits light by being applied with a forward bias voltage at a certain timing; however each pixel does not emit light in a certain period. In the non-light-emitting period, a reverse bias voltage is applied to the light emitting element so that the reliability of the light emitting element can be improved. The light emitting element has deterioration modes of reducing light intensity under a certain drive condition or reducing luminance apparently due to expansion of a non-light-emitting region within each pixel. When the light emitting element is driven by AC drive such that each pixel is applied with a forward bias voltage and a reverse bias voltage alternately, the deteriorations of the light emitting element can be hindered, thereby increasing the reliability of the light emitting device.

Note that the above-described configurations may be applicable to light emitting devices of another embodiment modes besides the light emitting devices as shown in FIGS. 3C and 5C.

Embodiment Mode 4

In light emitting devices of the invention, circuits provided in pixel portions for driving light emitting elements will be described in the present embodiment mode. Note that a circuit for driving a light emitting device is not limited to ones described in the present embodiment mode.

Figure 6A:
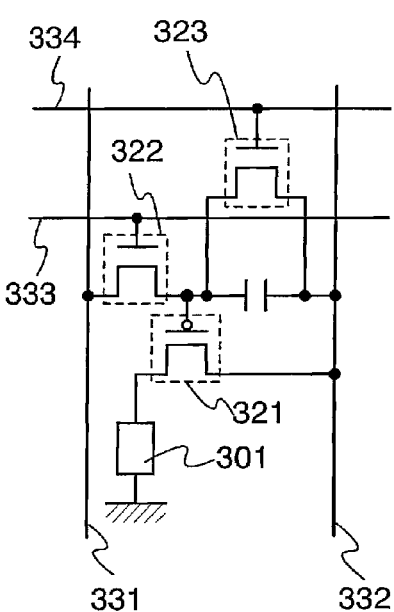
FIGS. 6A to 6C are equivalent circuit diagrams of pixels included in light emitting devices according to the invention.

As shown in FIG. 6A, a light emitting element 301 is connected to a circuit for driving each light emitting element. The circuit includes a driving transistor 321 for determining light-emission/non-light-emission of the light emitting element 301 by an image signal, a switching transistor 322 for controlling input of the image signal and an erasing transistor 323 for making the light emitting element 301 a non-light-emitting state regardless of the image signal. In this case, a source (or a drain) of the switching transistor 322 is connected to a source signal line 331. Sources of the driving transistor 321 and the erasing transistor 323 are connected to a power supply line 332 extending in parallel with the source signal line 331. A gate of the switching transistor 322 is connected to a first scanning line 333. A gate of the erasing transistor 323 extending in parallel with the first scanning line 333 is connected to a second scanning line 334. Further, the driving transistor 321 and the light emitting element 301 are connected in series with each other.

A driving method for making the light emitting element 301 emit light will be described. When the first scanning line 333 is selected in a writing period, the switching transistor 322 with the gate connected to the first scanning line 333 is turned on. When the image signal input in the source signal line 331 is input in the gate of the driving transistor 321 via the switching transistor 322, current flows through the light emitting element 301 from the power supply line 332, and hence, the light emitting element emits light. At this moment, the luminance of light emission is determined depending on the amount of current flowing through the light emitting element 301.

Figure 7:
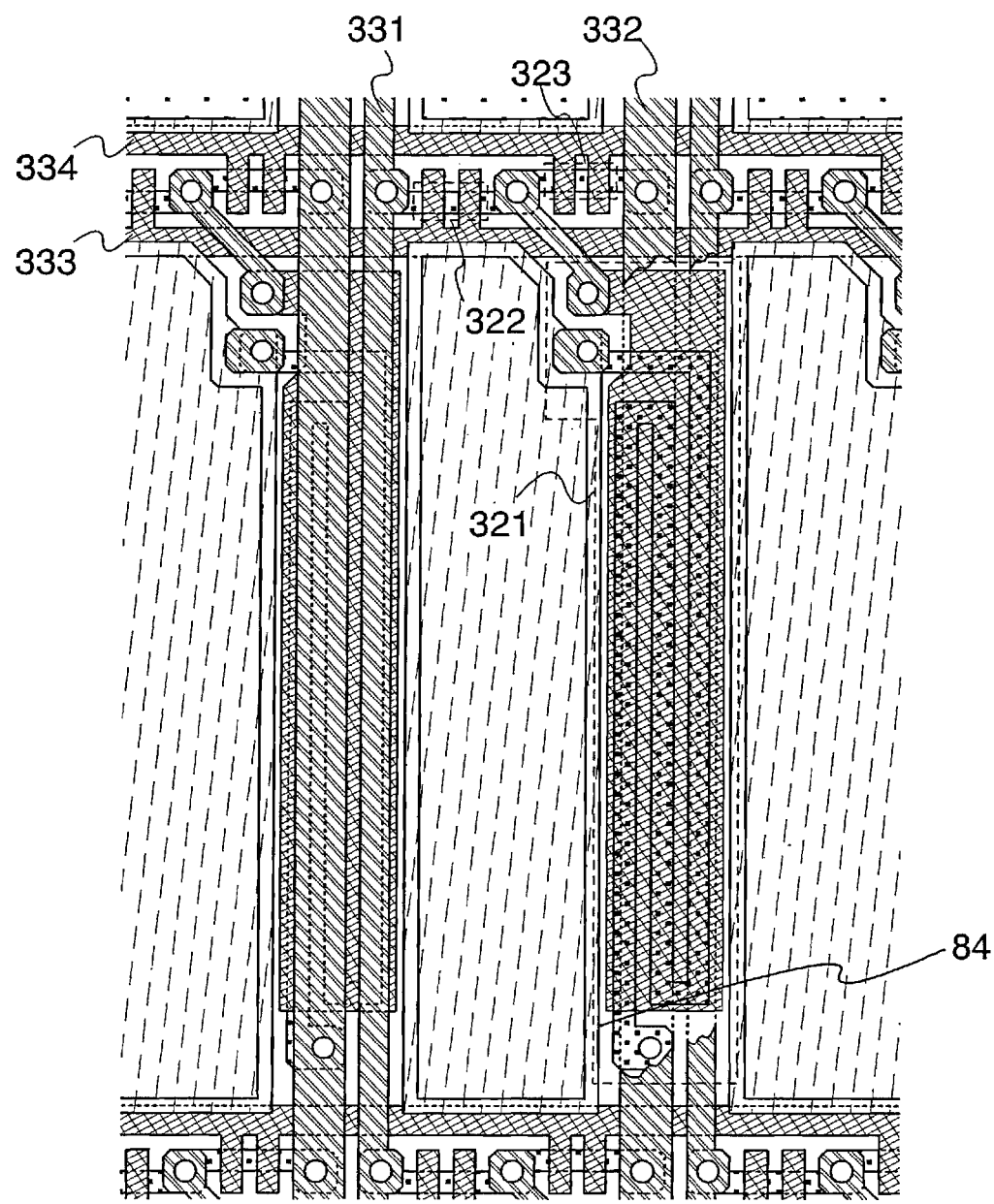
FIG. 7 is a top view of a pixel portion for a light emitting device according to the invention.

FIG. 7 is a top view of a pixel portion for a light emitting device having the circuit as shown in FIG. 6A. Reference numerals as shown in FIG. 7 represent same portions in FIG. 6A, respectively. Also, an electrode 84 of the light emitting element 301 is shown in FIG. 7.

The configurations of circuits connected to respective light emitting elements are not limited to the above-mentioned configuration. For example, the after-mentioned configurations as shown in FIGS. 6B and 6C may also be used.

Figure 6B:
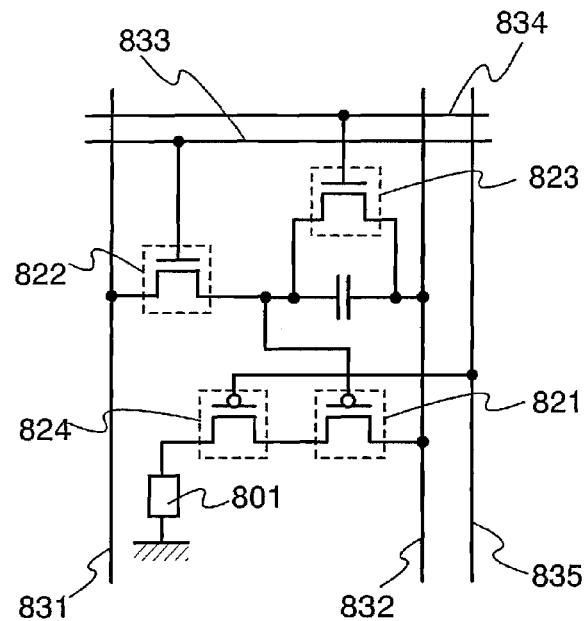
Figure 6C:
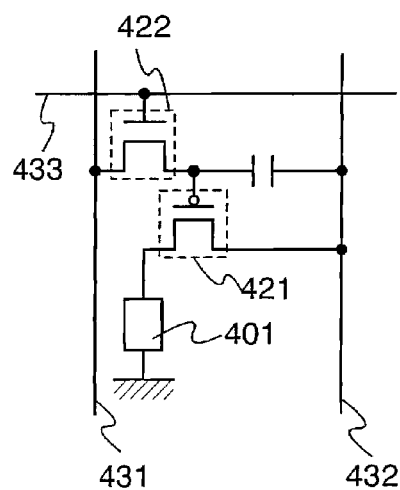

Next, the circuit as shown in FIG. 6B will be described. As shown in FIG. 6B, the circuit for driving each light emitting element is connected to a light emitting element 801. The circuit includes a driving transistor 821 for determining light-emission/non-light-emission of the light emitting element 801 by an image signal, a switching transistor 822 for controlling input of the image signal, an erasing transistor 823 for making the light emitting element 801 a non-light-emitting state regardless of the image signal, and a current controlling transistor 824 for controlling the amount of current flowing through the light emitting element 801. In this case, a source (or a drain) of the switching transistor 822 is connected to a source signal line 831. Sources of the driving transistor 821 and the erasing transistor 823 are connected to a power supply line 832 extending in parallel with the source signal line 831. A gate of the switching transistor 822 is connected to a first scanning line 833. A gate of the erasing transistor 823 is connected to a second scanning line 834 extending in parallel with the first scanning line 833. Further, the driving transistor 821 and the light emitting element 801 are connected in series with each other while sandwiching the current controlling transistor 824 therebetween. A gate of the current controlling transistor 824 is connected to the power supply line 835. The current controlling transistor 824 is formed and controlled such that current flows in a saturation region of voltage-current (Vd-Id) characteristics. This can determine the amount of current flowing through the current controlling transistor 824.

A driving method for making the light emitting element 801 emit light will be described. When the first scanning line 833 is selected in a writing period, the switching transistor 822 with the gate connected to the first scanning line 833 is turned on. The image signal input in the source signal line 831 is input in the gate of the driving transistor 821 via the switching transistor 822. Current flows through the light emitting element 801 from the power supply line 832 via the driving transistor 821 and the current controlling transistor 824 that is turned on upon receiving the signal from a power wiring 835, and hence, the light emitting element emits light. At this moment, the amount of current flowing through the light emitting element 801 is determined depending on the current controlling transistor 824.

Figure 8:
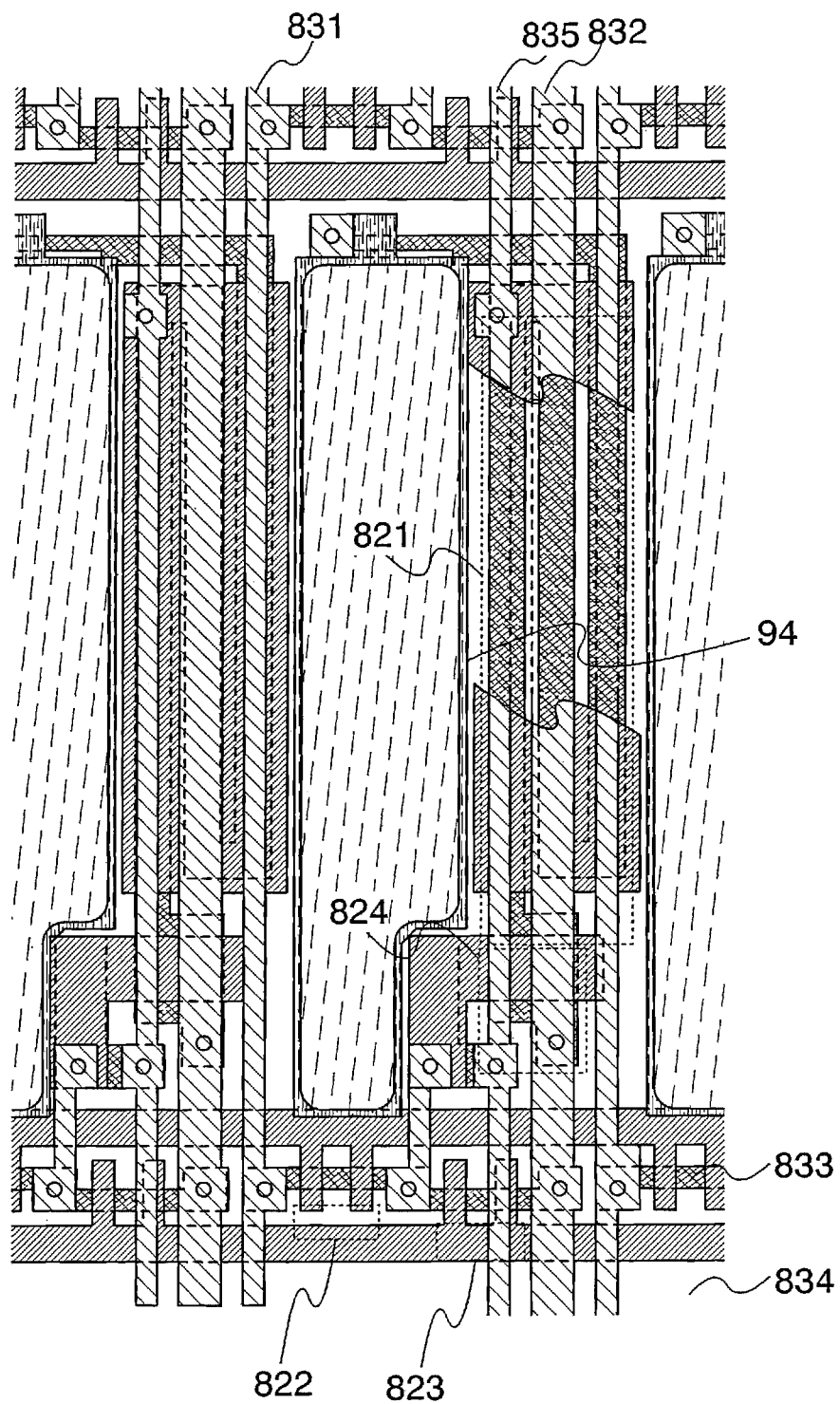
FIG. 8 is a top view of a pixel portion for a light emitting device according to the invention.

FIG. 8 is a top view of the pixel portion for the light emitting device having the circuit as shown in FIG. 6B. Reference numerals in FIG. 8 represent the same portions of FIG. 6B. Note that an electrode 94 of the light emitting element 801 is depicted in FIG. 8, though the light emitting element 801 is not illustrated therein.

Next, the circuit as shown in FIG. 6C will be described. The circuit for driving each light emitting element is connected to a light emitting element 401. The circuit includes a driving transistor 421 for determining light-emission/non-light-emission of the light emitting element 401 by an image signal and a switching transistor 422 for controlling input of the image signal. In this case, a source (or a drain) of the switching transistor 422 is connected to a source signal line 431. A source of the driving transistor 421 is connected to a power supply line 432 extending in parallel with the source signal line 431. A gate of the switching transistor 422 is connected to a scanning line 433. Further, the driving transistor 421 and the light emitting element 401 are connected in series with each other.

A driving method for making the light emitting element 401 emit light will be described. When the scanning line 433 is selected in a writing period, the switching transistor 422 with the gate connected to the scanning line 433 is turned on. When the image signal input in the source signal line 431 is input in the gate of the driving transistor 421 via the switching transistor 422, current flows through the light emitting element 401 from the power supply line 432, and hence, the light emitting element emits light. At this moment, the luminance of light emission is determined depending on the amount of current flowing through the light emitting element 401.

Embodiment Mode 5

Figure 9:
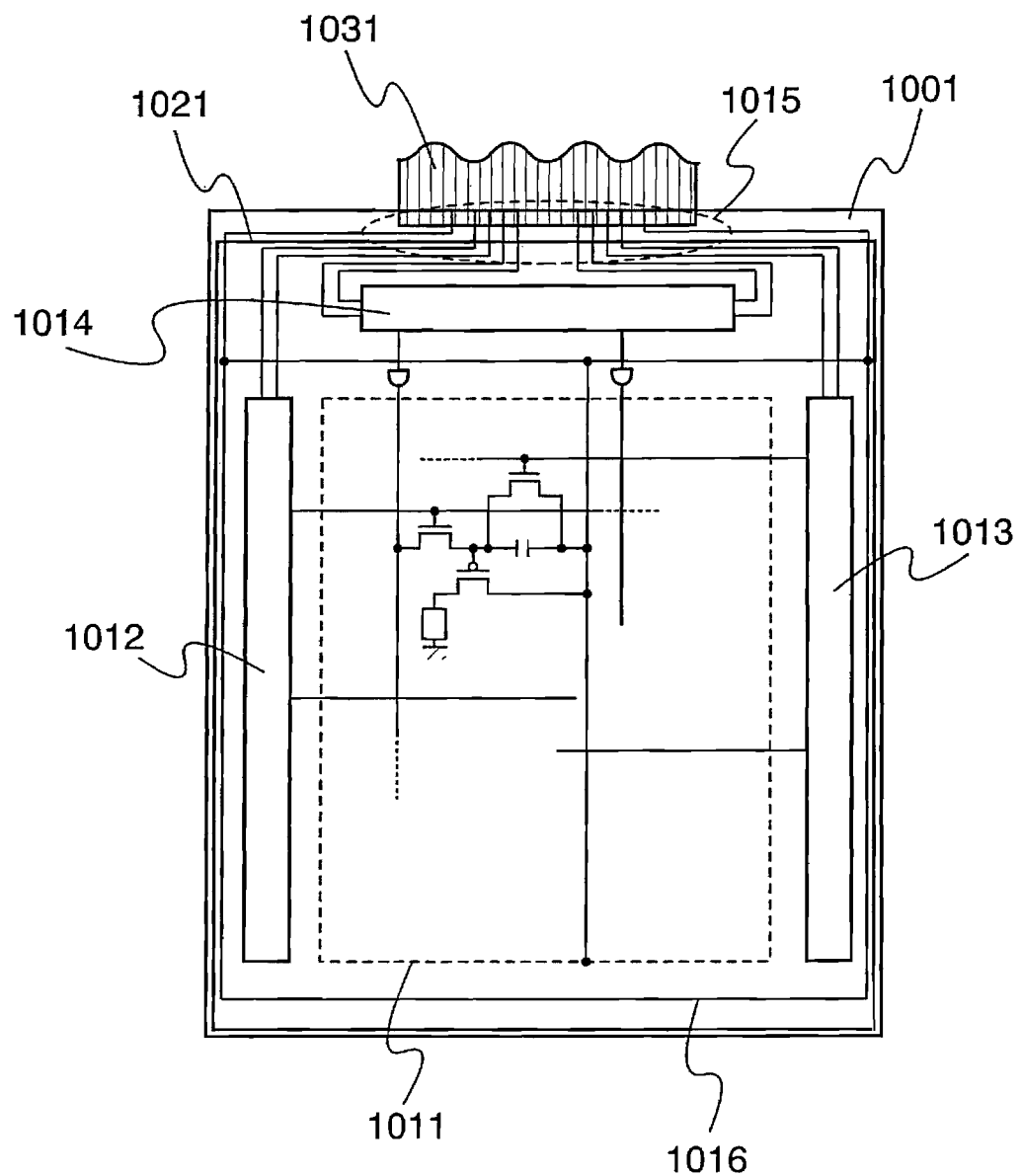
FIG. 9 is a top view of a light emitting device according to the invention.

FIG. 9 is a top view of a light emitting device, wherein the light emitting device manufactured according to the present invention is sealed and mounted with an external connection terminal.

A first substrate 1001 and a second substrate 1021 are attached to each other and overlapped with each other. A pixel portion 1011, a driver circuit portion 1012 for driving a first scanning line, a driver circuit portion 1013 for driving a second scanning line, a driver circuit portion 1014 for driving a source signal line, and a connection wiring group 1015 (which is surrounded by a dashed line) are provided over the first substrate 1001. A shift register, a buffer, a switch and the like are provided in the driver circuit portions 1012, 1013 and 1014. The connection wiring group 1015 and an FPC (a flexible printed circuit) 1031 that is an external connection terminal are connected to each other with an anisotropic conductive adhesive agent. Plural pixels each of which includes a light emitting element and a circuit for driving the light emitting element are aligned in the pixel portion 1011. Signals such as video signals, clock signals, start signals and reset signals are sent to the driver circuit portions 1012, 1013 and 1014, a power supply line 1016 and the like from a controller via the FPC 1031. Further, the signals are sent to the pixel portion from the driver circuit portions 1012, 1013 and 1014, and the power supply line 1016.

Note that the driver circuit portions are not necessary to be provided over the same substrate as the pixel portion 1011 as mentioned above. For example, these driver circuit portions may be provided outside of the substrate by using an FPC over which a wiring pattern is formed and an IC chip is mounted thereover (TCP).

The foregoing light emitting device is manufactured according to the manufacturing method capable of reducing defects due to electrostatic charge and utilizing a substrate surface effectively. That is, plural light emitting devices are manufactured over one substrate all together, which results in low manufacturing cost.

Figure 10:
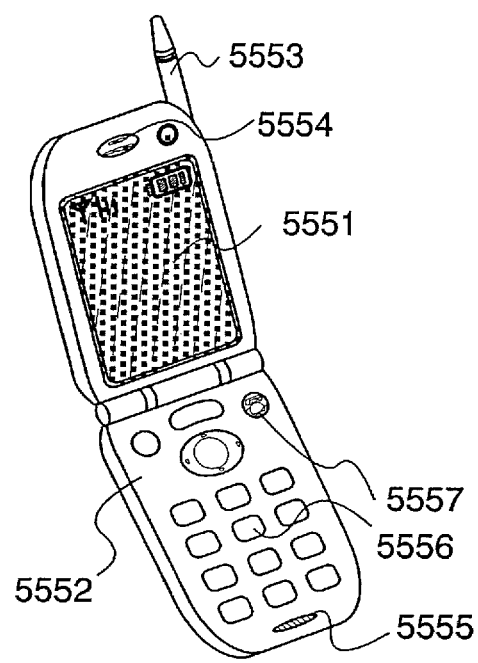
FIG. 10 is an electronic appliance applied with the present invention.

An embodiment of an electronic appliance mounted with a light emitting device according to the present invention is shown in FIG. 10. FIG. 10 shows a cellular phone manufactured according to the present invention, which includes a main body 5552, a display portion 5551, an audio output portion 5554, an audio input portion 5555, operational switches 5556, 5557, an antenna 5553 and the like. By incorporating the light emitting device of the invention as a display portion, display whose defects due to electrostatic charge that is caused during manufacturing process can be reduced is achieved, and hence, a cellular phone capable of displaying a favorable image can be manufactured. In addition to the cellular phone, the display device according to the present invention can be applied to a digital camera, a car navigation system, a display device and the like. This can reduce the display defects due to the electrostatic charge caused during the manufacturing process. Consequently, the digital camera, the car navigation system, the display device and the like each of which can provide favorable images can be completed.

As set forth above, the light emitting devices of the invention are suitable as display portions for various kinds of electronic appliances.

What is claimed is:

1. A semiconductor device comprising:
a pixel portion over a first substrate, the pixel portion comprising a plurality of pixels arranged in matrix, each of the pixels comprising a transistor comprising:
a gate electrode layer;
a first semiconductor layer; and
a first insulating layer between the gate electrode layer and the first semiconductor layer;
a second substrate attached to the first substrate by a sealing material, the sealing material surrounding the pixel portion along a periphery of the second substrate; and
a second semiconductor layer which extends along at least one side of the second substrate and is located outside the pixel portion,
wherein a length of the second semiconductor layer at the one side of the second substrate is longer than a length of the pixel portion at the one side of the second substrate, and
wherein the first semiconductor layer and the second semiconductor layer are formed on a same insulating surface and comprise a same material.

2. The semiconductor device according to claim 1, wherein each of the first semiconductor layer and the second semiconductor layer includes at least one of n-type and p-type impurities.

3. The semiconductor device according to claim 1, wherein the sealing material is epoxy resin.

4. The semiconductor device according to claim 1, wherein the sealing material overlaps with the second semiconductor layer.

5. The semiconductor device according to claim 1, wherein the same material includes silicon.

6. The semiconductor device according to claim 1, wherein the first insulating layer includes at least one of silicon oxide and silicon nitride.

7. The semiconductor device according to claim 1, further comprising a second insulating layer over the transistor,
wherein the sealing material overlaps with the second insulating layer.

8. The semiconductor device according to claim 7, wherein the second insulating layer comprises at least one of acrylic, siloxane and polyimide.

9. An electronic appliance including the semiconductor device according to claim 1.

10. A semiconductor device comprising:
a pixel portion over a first substrate, the pixel portion comprising a plurality of pixels arranged in matrix, each of the pixels comprising a transistor comprising:
a gate electrode layer;
a first semiconductor layer; and
a first insulating layer between the gate electrode layer and the first semiconductor layer;
a second substrate attached to the first substrate by a sealing material, the sealing material surrounding the pixel portion along a periphery of the second substrate; and
a second semiconductor layer surrounding the pixel portion along the periphery of the second substrate,
wherein the first semiconductor layer and the second semiconductor layer are formed on a same insulating surface and comprise a same material.

11. The semiconductor device according to claim 10, wherein each of the first semiconductor layer and the second semiconductor layer includes at least one of n-type and p-type impurities.

12. The semiconductor device according to claim 10, wherein the sealing material is epoxy resin.

13. The semiconductor device according to claim 10, wherein the sealing material overlaps with the second semiconductor layer.

14. The semiconductor device according to claim 10, wherein the same material includes silicon.

15. The semiconductor device according to claim 10, wherein the first insulating layer includes at least one of silicon oxide and silicon nitride.

16. The semiconductor device according to claim 10, further comprising a second insulating layer over the transistor,
wherein the sealing material overlaps with the second insulating layer.

17. The semiconductor device according to claim 16, wherein the second insulating layer comprises at least one of acrylic, siloxane and polyimide.

18. An electronic appliance including the semiconductor device according to claim 10.

19. The semiconductor device according to claim 1, further comprising a driver circuit portion electrically connected to the pixel portion,
wherein the second semiconductor layer is located outside the driver circuit portion.

20. A semiconductor device comprising:
a pixel portion over a first substrate, the pixel portion comprising a plurality of pixels arranged in matrix, each of the pixels comprising a transistor comprising:
a gate electrode layer;
a first semiconductor layer; and
a first insulating layer between the gate electrode layer and the first semiconductor layer;
a second substrate attached to the first substrate by a sealing material, the sealing material surrounding the pixel portion along a periphery of the second substrate;
a second semiconductor layer which extends along at least one side of the second substrate and is located outside the pixel portion;
a second insulating layer over a channel formation region of the transistor and a part of the second semiconductor layer, wherein the second semiconductor layer extends beyond a side edge of the second insulating layer; and
a conductive layer over the second insulating layer and the second semiconductor layer,
wherein the conductive layer is in contact with the side edge of the second insulating layer and an upper surface of the second semiconductor layer,
wherein an edge of the conductive layer and an edge of the second semiconductor layer are aligned, and
wherein the first semiconductor layer and the second semiconductor layer are formed on a same insulating surface and comprise a same material.

21. The semiconductor device according to claim 20, wherein the sealing material overlaps with the conductive layer and the second semiconductor layer.

22. The semiconductor device according to claim 20, wherein the same material includes silicon.

23. The semiconductor device according to claim 20, wherein the first insulating layer includes at least one of silicon oxide and silicon nitride.

24. The semiconductor device according to claim 20, further comprising a third insulating layer over the transistor, wherein the sealing material overlaps with the third insulating layer.

25. The semiconductor device according to claim 24, wherein the third insulating layer comprises at least one of acrylic, siloxane and polyimide.

26. The semiconductor device according to claim 20, further comprising a driver circuit portion electrically connected to the pixel portion,
wherein the second semiconductor layer is located outside the driver circuit portion.

* * * * *

UNITED STATES PATENT AND TRADEMARK OFFICE
CERTIFICATE OF CORRECTION

PATENT NO.        : 8,674,369 B2                      Page 1 of 1
APPLICATION NO.   : 13/478659
DATED             : March 18, 2014
INVENTOR(S)       : Satoshi Murakami et al.

It is certified that error appears in the above-identified patent and that said Letters Patent is hereby corrected as shown below:

In the Specification

Column 3, line 64, "OF." should be --OF--;

Column 7, line 44, "(Li," should be --(Li) ),--;

Column 15, lines 4-5, "julolidy l-9-enyl)" should be --julolidyl-9-enyl)--;

Column 15, lines 6-7, "julolid yl-9-enyl)" should be --julolidyl-9-enyl)--;

Column 15, lines 8-9, "julolidy l-9-enyl)" should be --julolidyl-9-enyl)--;

Column 16, line 16, "polyethylene" should be --poly(ethylene--;

Column 17, line 5, "emitting," should be --emitting--;

Column 17, line 48, "polyethylene" should be --poly(ethylene--.

Signed and Sealed this
Second Day of September, 2014

Michelle K. Lee
*Deputy Director of the United States Patent and Trademark Office*